US012123842B2

(12) United States Patent
Hiltunen et al.

(10) Patent No.: US 12,123,842 B2
(45) Date of Patent: Oct. 22, 2024

(54) METHOD AND DEVICE FOR DETERMINING FIBRE POROSITY IN A FIBRE SUSPENSION, AND CONTROL SYSTEM

(71) Applicant: KAAKKOIS-SUOMEN AMMATTIKORKEAKOULU OY, Mikkeli (FI)

(72) Inventors: Yrjö Hiltunen, Savonlinna (FI); Ekaterina Nikolskaya, Savonlinna (FI); Jari Käyhkö, Savonlinna (FI)

(73) Assignee: KAAKKOIS-SUOMEN AMMATTIKORKEAKOULU OY, Mikkeli (FI)

( * ) Notice: Subject to any disclaimer, the term of this patent is extended or adjusted under 35 U.S.C. 154(b) by 157 days.

(21) Appl. No.: 17/950,863

(22) Filed: Sep. 22, 2022

(65) Prior Publication Data

US 2023/0023249 A1 Jan. 26, 2023

Related U.S. Application Data

(63) Continuation-in-part of application No. PCT/FI2021/050239, filed on Mar. 31, 2021.

(30) Foreign Application Priority Data

Mar. 31, 2020 (FI) ..................................... 20205320

(51) Int. Cl.
*G01N 24/08* (2006.01)
*G01N 1/20* (2006.01)
(Continued)

(52) U.S. Cl.
CPC ......... *G01N 24/082* (2013.01); *G01N 1/2035* (2013.01); *G01N 15/08* (2013.01);
(Continued)

(58) Field of Classification Search
CPC .... G01N 1/2035; G01N 15/08; G01N 24/082; G01R 33/448; G01R 33/4625
See application file for complete search history.

(56) References Cited

U.S. PATENT DOCUMENTS 5,371,464 A * 12/1994 Rapoport ............. G01R 33/307
324/306
2016/0245764 A1 8/2016 Valori et al.

FOREIGN PATENT DOCUMENTS

WO 2017220859 A1 12/2017

OTHER PUBLICATIONS

International Search Report in corresponding International Patent Application No. PCT/FI2021/050239, mailed Jul. 26, 2021, 4 pages.
(Continued)

*Primary Examiner* — Steven L Yeninas
(74) *Attorney, Agent, or Firm* — FisherBroyles, LLP; Robert Kinberg

(57) ABSTRACT

Disclosed is a method for determining fibre porosity in a fibre suspension. A sample is taken from a fibre suspension and fibre porosity determination is performed by determining the ratio of fibre-internal water to fibre-external bound water as an online measurement using a NMR spectroscope in successive steps of: generating a magnetic field for exciting protons of water contained in the sample; exciting water molecules of fibre suspension contained in the sample with a frequency pulse provided by a coil; measuring a return signal of the frequency pulse that returns from water molecules to the coil; determining the proton relaxation time and the amplitude of the return signal from the return signal; and determining fibre porosity of the fibre suspension based on the amplitude and the relaxation time of the exponential return signal. Also disclosed is a device for determining fibre porosity of a fibre suspension and a control system connected to a fibre web machine.

9 Claims, 7 Drawing Sheets

(51) Int. Cl.
  *G01N 15/08* (2006.01)
  *G01R 33/44* (2006.01)
  *G01R 33/46* (2006.01)
(52) U.S. Cl.
  CPC ....... *G01R 33/448* (2013.01); *G01R 33/4625* (2013.01); *G01N 24/085* (2013.01)

(56) References Cited

OTHER PUBLICATIONS

Peng Ji et al., Characterization of Water State and Distribution in Fibre Materials by Low-Field Nuclear Magnetic Resonance, RSC Adv. 2016, 6, pp. 11492-11500.
Andreasson et al., The porous structure of pulp fibres with different yields and its influence on paper strength, Cellulose 10: pp. 111-123, 2003.
Zhang et al., Hierarchical porous structures in cellulose: NMR relaxometry appraoch, Polymer 98, 2016, pp. 237-243.
Finnish Search Report in corresponding Finnish Patent Application No. 20205320, dated Oct. 21, 2020, 1 page.
Zimmerman et al., Nuclear Magnetic Resonance Studies in Multiple Phase Systems: Lifetime of a Water Molecule in an Adsorbing Phase on Silica Gel, Magnolia Petroleum Company, Field Research Laboratory, Dallas, Texas, Received Feb. 25, 1957, vol. 61, pp. 1328-1333.

* cited by examiner

METHOD AND DEVICE FOR DETERMINING FIBRE POROSITY IN A FIBRE SUSPENSION, AND CONTROL SYSTEM

CROSS-REFERENCE TO RELATED APPLICATIONS

This application is a Continuation-in-Part of International Application No. PCT/FI2021/050239 filed on Mar. 31, 2021, which claims priority from Finland application No. 20205320 filed on Mar. 31, 2020, the entire contents of both foregoing applications being incorporated herein by reference.

FIELD OF THE INVENTION

The invention relates to a method for determining fibre porosity in a fibre suspension, wherein a sample is taken from a fibre suspension and fibre porosity is determined by determining the ratio of fibre-internal water to fibre-external bound water. The invention also relates to a device for determining fibre porosity of a fibre suspension and a control system connected to a fibre web machine.

BACKGROUND OF THE INVENTION

In the manufacturing of paper and board products, an essential metric of fibre material is the porosity of fibres, which is controlled mainly by refining. In paper production, porosity influences the runnability of the paper machine particularly through the efficiency of dewatering, but it also influences other paper properties.

The beating rate of pulp has a strong effect on the properties of the end product; for example, it is possible to increase the tensile strength of a product by increasing refining. On the other hand, pulp refining consumes energy and impairs dewatering thus reducing the highest possible production speed of the paper machine and decreasing production.

Porosity is also a significant fibre property in pulp production.

Traditionally, fibre porosity of a fibre suspension has been assessed with the determination of the Water Retention Value (WRV), which is performed as a laboratory measurement. The laboratory determination of the WRV value comprises steps of performing a first weighing of a wet fibre suspension, after which free water is squeezed out and the sample is centrifuged for removing fibre-external bound water. A second weighing is performed after this. As the remainder of the first and the second weighing, the amount of free water removed from the fibre suspension can be determined. The determination is continued further by drying the sample for removing fibre-internal bound water, which is followed by a third weighing. Based on the remainder of the second and the third weighing, it is possible to determine the amount of water bound to the sample. With the ratio of bound to free water, it is possible to assess the properties of refining, whether refining mainly breaks fibres, fibrillates fibres externally or fibrillates fibres internally.

A problem with the traditional determination of the WRV value (or the WRV index) is its slowness and work intensity. The total duration of several weighing processes and drying steps is several hours and the determination requires multiple manual work steps. Thus, the utilisation of measurement results for controlling the process is slow.

SUMMARY OF THE INVENTION

An object of the invention is to provide a technical method that enables automatic determination of fibre porosity in a fibre suspension faster than with prior art methods.

The present invention is characterized by a method for determining fibre porosity in a fibre suspension, wherein a sample is taken from a fibre suspension and fibre porosity is determined by determining the ratio of fibre-internal water to fibre-external bound water and fibre porosity as an online measurement using a NMR spectroscope in successive steps of generating a magnetic field for exciting protons of water contained in the sample and exciting water molecules of fibre suspension contained in the sample with a frequency pulse provided by a coil. In addition, in the method, the return signal of the frequency pulse returning to the coil from the water molecules is measured, the proton relaxation time and the amplitude of the return signal are determined from the return signal, and fibre porosity of the fibre suspension is determined based on the amplitude of the exponential return signal and the relaxation time.

The method according to the invention enables automatic determination of fibre porosity as on online measurement and in near real time without time-consuming and arduous laboratory measurements. NMR spectroscopy can be performed very quickly and the total duration of the determination is only a few seconds. Surprisingly, it has been detected that porosity can be reliably determined as an online measurement based on the amplitude and relaxation time of NMR spectroscopy.

Advantageously, a general model of the return signal is as follows:

$$\mathrm{Exp} = \left(\sum_1^4 A_x \exp(R_x * t)\right) + C$$

where Exp is the return signal, $A_x$ is the amplitude of the return signal, $R_x$ is the relaxation speed and t is the signal, measurement time and C is an empirical constant. This calculation model has been found to effectively correlate with the WRV index determined as a laboratory measurement.

Advantageously, fibre porosity of a fibre suspension is determined based on the amplitude and relaxation time of the return signal using a single or a double exponential signal model or both for determining the relaxation time. The single and double exponential signal models for determining the relaxation time can be alternative relative to each other, but preferably complement each other when used simultaneously for determining fibre porosity.

The model uses a relaxation speed or $R_x$, the ratio of which to the relaxation time T is T=1/R.

According to a first embodiment, fibre porosity of a fibre suspension is determined using a model that consists of only one exponential signal Exp=A*exp ($R_2$*t) for determining the relaxation time and the linear formula $WRV_{NMR}$=kk*[$R_2$−a*(c−$c_{ref}$)]+C for determining fibre porosity as a WRV value, where kk is the slope of the linear formula, a is an empirical constant, c is the sample consistency, $c_{ref}$ is the reference consistency and C is a second empirical constant. In this way, with a simple model, it is possible to perform the determination of the WRV index with the help of parameters obtained from the NMR measurement using a calculation model based on one exponential signal, which also works very well for lower consistencies. The consistency of the sample can be derived from basic process measurements that usually include measurement of consistency of the fibre suspension, for example by using a Valmet Microwave Consistency Measurement device.

The value of the empirical constant "a" can range between 0.17 and 0.30 1/(%*s), preferably between 0.18 and 0.20 1/(%*s), and the value of the second empirical constant C between 1.0 and 2.5 1/s, preferably between 1.4 and 2.0 1/s. Thus, with the method according to the invention, a sufficiently good accuracy is achieved in order that the measurement results can be used for controlling refining, for example.

Advantageously, fibre porosity is determined as a WRV value. The WRV value is a very commonly used measurement unit of porosity, which indicates the relative weight of water compared to the fibre weight.

In addition to fibre porosity, the method preferably determines the consistency of the sample. In this way, the WRV value preferably used as a fibre porosity measure can be interpreted relative to consistency, thus improving the usability of the measurement.

According to a second embodiment, fibre porosity of a fibre suspension is determined using a model that consists of two exponential signals $Exp=A_I*exp(R_{2I}*t)+A_E*exp(R_{2E}*t)+D$ for determining the relaxation time, where D is a third empirical constant. When using such a double exponential signal model, a so-called physical model is provided, which correlates particularly well with fibre porosity. In the physical model, one exponential signal is from fibre-internal water and the other one is from fibre-external water. However, the physical model alone can be sensitive to external errors, if the consistency of the sample is very low and the proportion of fibre-internal water is very small relative to that of external water.

Fibre porosity is preferably determined as a WRV value in the double exponential signal model in successive steps of calculating, based on the amplitudes $A_I$ and $A_E$, the relative amount of fibre-internal water $A_{I\_rel}$ and the relative amount of external water $A_{E\_rel}$ and calculating the amount of bound water in fibre $W_{IB}$ based on the relative amount of fibre-internal water $A_{I\_rel}$ and the consistency c. The method additionally involves calculating the proportion of water in fibre bound inside fibre $p_{IB}$ based on the relaxation speed of completely free water $R_{2F}$, the relaxation speed of completely bound water $R_{2B}$ and the relaxation speed of fibre-internal bound water $R_{2I}$, calculating the proportion of water in fibre bound outside fibre $p_{EB}$ based on the relaxation speed of completely free water $R_{2F}$, the relaxation speed of completely bound water $R_{2B}$ and the relaxation speed of fibre-external bound water $R_{2E}$, and calculating the amount of bound water in fibre $W_{IB}$ based on the relative amount of fibre-internal water $A_{I\_rel}$, the proportion of water bound in fibre $p_{IB}$ and the consistency c, and calculating the amount of bound water outside fibre $W_{EB}$ based on the relative amount of fibre-external water $A_{E\_rel}$, the proportion of water bound outside fibre $p_{EB}$ and the consistency c. Furthermore, the method involves calculating the WRV value as a sum of the amount of bound water in fibre $W_{IB}$ and the amount of bound water outside fibre $W_{EB}$. Information obtained in intermediate steps regarding the amounts of fibre-internal bound water and external bound water can be utilised when assessing the performance of refining. The amount of fibre-internal water correlates to how refining has provided fibre-internal fibrillation, whereas the amount of external bound water correlates to how refining has provided fibre-external fibrillation.

The value of the third empirical value D can be between 0 and 1. It has been found that the double exponential model achieves good accuracy with such numerical values.

The relaxation speed of completely free water $R_{2F}$ and completely bound water $R_{2B}$ can be determined separately and then assumed as constants in the in the double exponential signal model. The relaxation speed of completely free water $R_{2F}$ can be determined from a sample of pure water, whereas the relaxation speed of completely bound water $R_{2B}$ can be determined from a complete dry pulp sample including only bound water. Thus, these values can be used as constants in the calculation.

Advantageously, the method also involves determining the ratio of bound to free water both inside and outside fibre. In the double exponential model, this can be determined directly from the values provided by the model, whereas in the single exponential model, measured relaxation times or relaxation speeds or both are compared to empirically defined reference values.

According to a third advantageous embodiment, fibre porosity is determined using both the single exponential signal model for determining a first porosity value and the double exponential signal model for determining a second porosity value, and said first porosity value and second porosity value are compared to each other for forming a comparison result, based on which fibre porosity is determined. Simultaneous use of both the single and the double exponential signal models improves the reliability of the method. While the computational single exponential signal model forecasts the actual situation slightly defectively, a physical situation of two exponential signals models the physical situation better. Instead, the double exponential model is more sensitive to external disturbances, which do not affect the single exponential model in a corresponding way. Thus, by comparing the results of these, it is possible to improve the reliability of the method.

The comparison result can be calculated as the remainder of the first porosity result and the second porosity result and by dividing said remainder by the first porosity result. If the comparison result is less than 5% of the first porosity result, fibre porosity is calculated as the mean value of the first porosity result and the second porosity result. This is one way of utilising the comparison of the results of the single and the double exponential signal models for improving the reliability of the method. On the other hand, if the result differs more than 5%, one of the first porosity value and the second porosity value can be considered as fibre porosity with a pre-selected criterion, where the pre-selected criterion can be, for example, the selected limit value of the sample consistency.

According to an embodiment, the calculated fibre porosity value is used in controlling the refiner after filtering, for example, by using a Kalman filter for reducing the fluctuation of control.

Alternatively, instead of the model that uses one or two exponents of the general model, it can be contemplated that the model can include even three or four exponents, if such calculation method correlates well with the reality.

In the method, the sample is advantageously stopped for performing the NMR spectroscopy measurement. Thus, the measurement accuracy can be improved when the frequency pulse resent by all of the protons included in the sample can be measured.

A further object of the invention is to provide a device that enables automatic determination of fibre porosity in a fibre suspension faster than with prior art devices. The present invention is therefore further characterized by a device for determining fibre porosity of a fibre suspension including equipment for determining fibre porosity based on a sample comprising a sample channel, a computer and programmable means, as well as connection means for connecting the equipment to a refiner, either directly to a fibre suspension flow channel or to a side flow channel, which side flow channel is arranged to lead part of the fibre suspension flow arriving from the refiner to form a separate sample. The device is arranged to be connected to the refiner for determining fibre porosity as an online measurement, and the equipment for determining porosity is a time-domain NMR spectroscope. The NMR spectroscope includes at least one coil arranged around the sample channel to excite water protons of the fibre suspension in the sample with frequency pulses, a magnet arranged around the sample channel for generating a magnetic field in the sample channel, a power source complete with controllers connected to the coil for forming frequency pulses, and measuring equipment for measuring the intensity of current generated by the frequency pulse that returns to the coil from protons for forming a return signal. The computer is equipped with said programmable means for determining the porosity of samples based on the return signal in successive steps, and programmable means are arranged to determine the proton relaxation time and the amplitude of the return signal from the return signal and to determine fibre porosity of the fibre suspension based on the amplitude and relaxation time of the exponential return signal.

With a device according to the invention, determination of fibre porosity can be performed as an online measurement by connecting a NMR spectroscope to the fibre suspension flow channel and by leading fibre suspension flowing in the flow channel through the NMR spectroscope. Such a device is very fast to use and does not require the operator's manual work steps during the measurement. Implemented with the time-domain spectroscopy, the device can be quite simple in design and affordable to realise.

Advantageously, programmable means are arranged to determine fibre porosity of a fibre suspension using a general model of the return signal $$\mathrm{Exp} = \left( \sum_1^4 A_x \exp(R_x * t) \right) + C$$

for determining the relaxation time, where Exp is the return signal, A is the amplitude of the return signal, $R_x$ is the relaxation speed and t is the signal measurement time.

The connection means advantageously include the side flow channel, in which the equipment is installed. Thus, the fibre suspension of the entire side flow channel can be led through the NMR spectroscope and it is not necessary to arrange sampling inside the flow channel, where it would be easily exposed to accumulation of fibre suspension and clogging.

According to an embodiment, the device includes a pump located in the side flow channel after the NMR spectroscope for aspirating a sample from the flow channel to the side flow channel and the NMR spectroscope. By using a pump, the flow of the fibre suspension to the NMR spectroscope and, after the measurement, through it can be ensured even in situations where the stock consistency is higher than 1%.

Advantageously, programmable means are arranged to determine the proton relaxation time and the amplitude of the return signal from the return signal and to determine fibre porosity of the fibre suspension based on the amplitude and relaxation time of the return signal using both the single and the double exponential signal models for determining the relaxation time. A simultaneous parallel use of the single and double exponential models enables the comparison of the results and achievement of better reliability in determining porosity.

A further object of the invention is to provide a control system, with which it is possible to control refining of a fibre web machine faster than with prior art control systems based on fibre porosity. The present invention is characterized by a control system connected to a fibre web machine, including a device according to any of the embodiments proposed above for measuring the porosity of individual fibres of a fibre suspension, a computing unit for calculating control parameters based on fibre porosity measured with a measurement unit and a selected target, and data transfer equipment for transferring control parameters to the computing unit to the refiner for controlling the refiner for achieving the target. When using a device according to the invention, a control system according to the invention can quickly react to the results obtained from the porosity measurement thus controlling the refiner operation in such a way that properties of the refined fibre suspension form an optimal compromise between the runnability of the fibre web machine and properties of the end product. The response of a control system according to the invention is very fast and refining can thus be quickly controlled to a desired level, which reduces runnability problems in a fibre web machine and, on the other hand, accelerates achievement of product quality targets set. Hence, the portion of production sent to reject is reduced and the total production efficiency increases.

According to an embodiment, the control system includes two side flow channels for taking a sample both before and after the refiner. In this way, comparisons can be made regarding the effect of refining on fibres by examining fibre porosity before and after the refiner.

Advantageously, the computing unit is arranged to calculate fibre porosity of the samples taken before and after the refiner and the related comparison value and to control the refiner or the fibre web machine based on the comparison value. Thus, changes can be made very quickly to the operation of the refiner or the fibre web machine.

According to an embodiment, the control system includes a first valve and a third valve arranged in side flow channels for stopping the sample during the measurement. In this way, the measurement is more reliable when it is known that each excited proton also releases its energy back to the coil so that it can be measured.

A method, a device and a control system according to the invention solve the problem of slowness related to porosity measurement and offer a solution, with which the operation of the refiner can be controlled quickly. Although it has also been possible to determine the ratio of water bound to fibre to free water in the applicant's own publication WO 2017/220859 A1, where the beating rate of a fibre suspension is determined using the time-domain NMR spectroscopy, this method and system cannot have been used for determining porosity due to defective computation. To determine porosity, instead of the mere ratio of bound to free water, information about the amounts of bound and free water both inside and outside fibre is preferably also needed. Hence, this publication has not proposed a method and a solution for problems related to porosity measurement. For the time being, the only method used to reliably measure porosity has been the traditional laboratory measurement of the WRV value.

BRIEF DESCRIPTION OF THE DRAWINGS

The invention is described below in detail with reference to the accompanying drawings that illustrate some of the embodiments of the invention, in which.

DETAILED DESCRIPTION OF THE INVENTION

Figure 1:
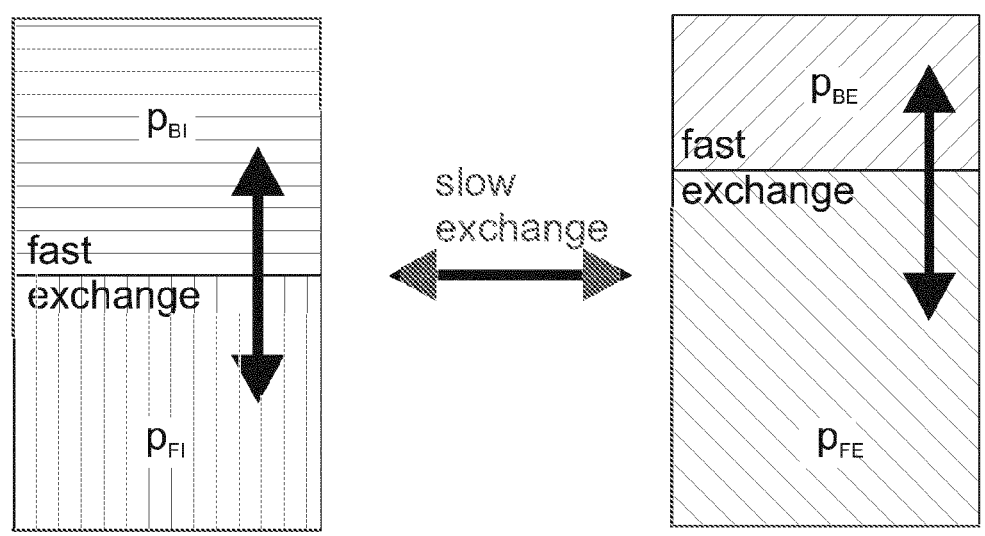
FIG. 1 is a basic view of the location and movements of water relative to fibre.

FIG. 1 depicts a basic view of how water is located relative to fibre. It is known that fibre includes internally bound water $p_{IB}$ and fibre-internally free water $p_{FI}$. Water molecules can change place fibre-internally binding to water bound from free water or releasing from bound water into free water quite quickly due to physical phenomena or chemical reactions. Correspondingly, outside fibre, water $p_{BE}$ as well as free water $p_{FE}$ has bound to the fibre surface. Outside fibre, the transfer from bound water to free water and vice versa can also take place quickly. Instead, the transfer from fibre-internal water to external water has been found to be slow, due to the secondary wall structure of fibre. The sum of the proportions of fibre-internal free and bound water $p_{BI}+p_{FI}=1$ and the total sum of the proportions of external free and bound water $p_{BE}+p_{FE}=1$. The basic calculation principles of water exchange are known from the publication of Zimmerman, J. & Brittin, W. (1957). "Nuclear Magnetic Resonance Studies in Multiple Phase Systems: Lifetime Of A Water Molecule In An Adsorbing Phase On Silica Gel.," J. Phys. Chem., 61(10), 1328-1333. doi: 10.1021/j150556a015, see equations 48 and 50.

Figure 2A:
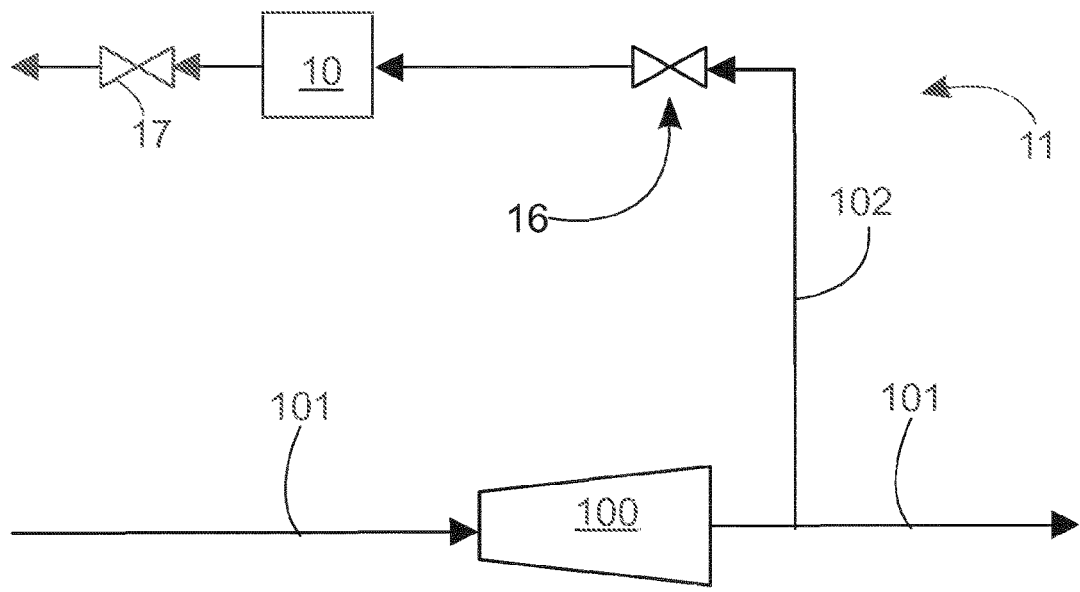
FIG. 2a depicts the process position according to a first embodiment of the system according to the invention.
Figure 2B:
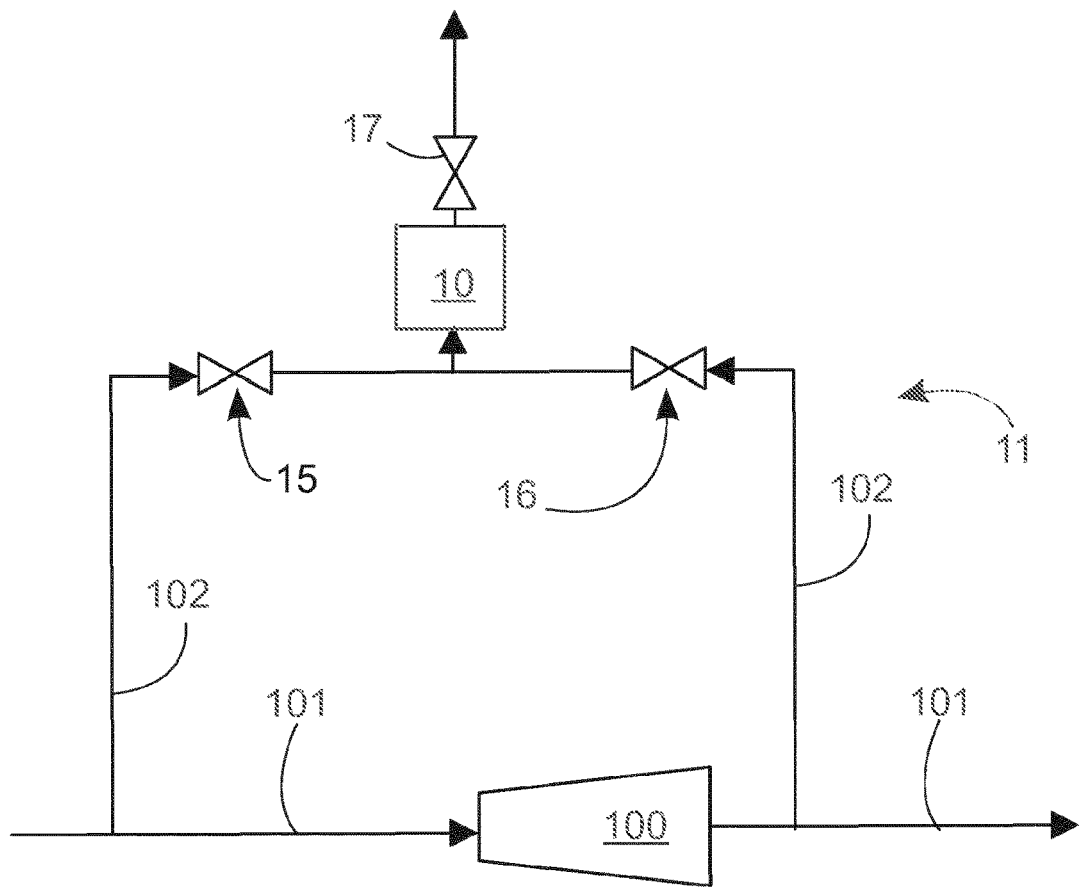
FIG. 2b depicts the process position according to a second embodiment of the system according to the invention.

As shown in FIGS. 2a and 2b, a device 10 according to the invention is arranged to be used in context with a refiner 100. According to FIG. 1a, the device 10 can be located in such a way that a small side flow is deviated from the flow 101 of the fibre suspension flow channel 101 going to the refiner 100 into a side flow channel 102, which is positioned, as shown in FIG. 1a, after the refiner 100 and which leads part of the fibre suspension flow to the device 10 according to the invention. The device 10 is advantageously connected to the side flow channel 102, which can be an already existing flow channel associated with the refiner or a part of a system according to the invention installed for this purpose.

The side flow channel 102 advantageously has a first valve 16 for sampling, with which it is possible to adjust the volume and flow rate of fibre suspension entering the device 10, and a second valve 17, with which the sample can be stopped in the device 10 for the duration of the measurement. According to FIG. 2b, a fibre suspension flow can also be led to the device 10 via two side flow channels 102. One side flow channel 102 is preferably a flow channel, which is used to lead the fibre suspension flow before the refiner 100 through the one first valve 16 to the device 10. The other side flow channel 102 is advantageously a flow channel, which is used to lead the fibre suspension flow after the refiner 100 through the second valve 15 to the device 10. In this way, it is possible to perform comparative measurements on both the fibre suspension that enters the refiner and the fibre suspension, already refined, that exits the refiner. The size of the sample led from the fibre suspension to the device can be as small as 1-10 cm$^3$, in which case the equipment is also relatively small-scale. Nevertheless, such a sample is sufficient for determining fibre porosity.

According to FIGS. 2a-4, in the method according to the invention, part of the fibre suspension flow can be led to a side route for an online measurement, wherein the measurement is performed using the device 10 according to the invention. The first valve 16 is used to control sampling from the fibre suspension flow 14. Arranged in context with the side flow channel 102, there is a device 10 according to the invention comprising connection means 13 and equipment 18 for determining fibre porosity of the fibre suspension based on a sample, which equipment 18 is a time-domain NMR spectroscope 20. The connection means 13 can consist of connections, with which the sample channel 12 of the NMR spectroscope 20 is connected to the side flow channel 102 so that the sample channel 12 and the side flow channel 102 form a continuous route for the fibre suspension up to and through the NMR spectroscope 20.

Figure 3:
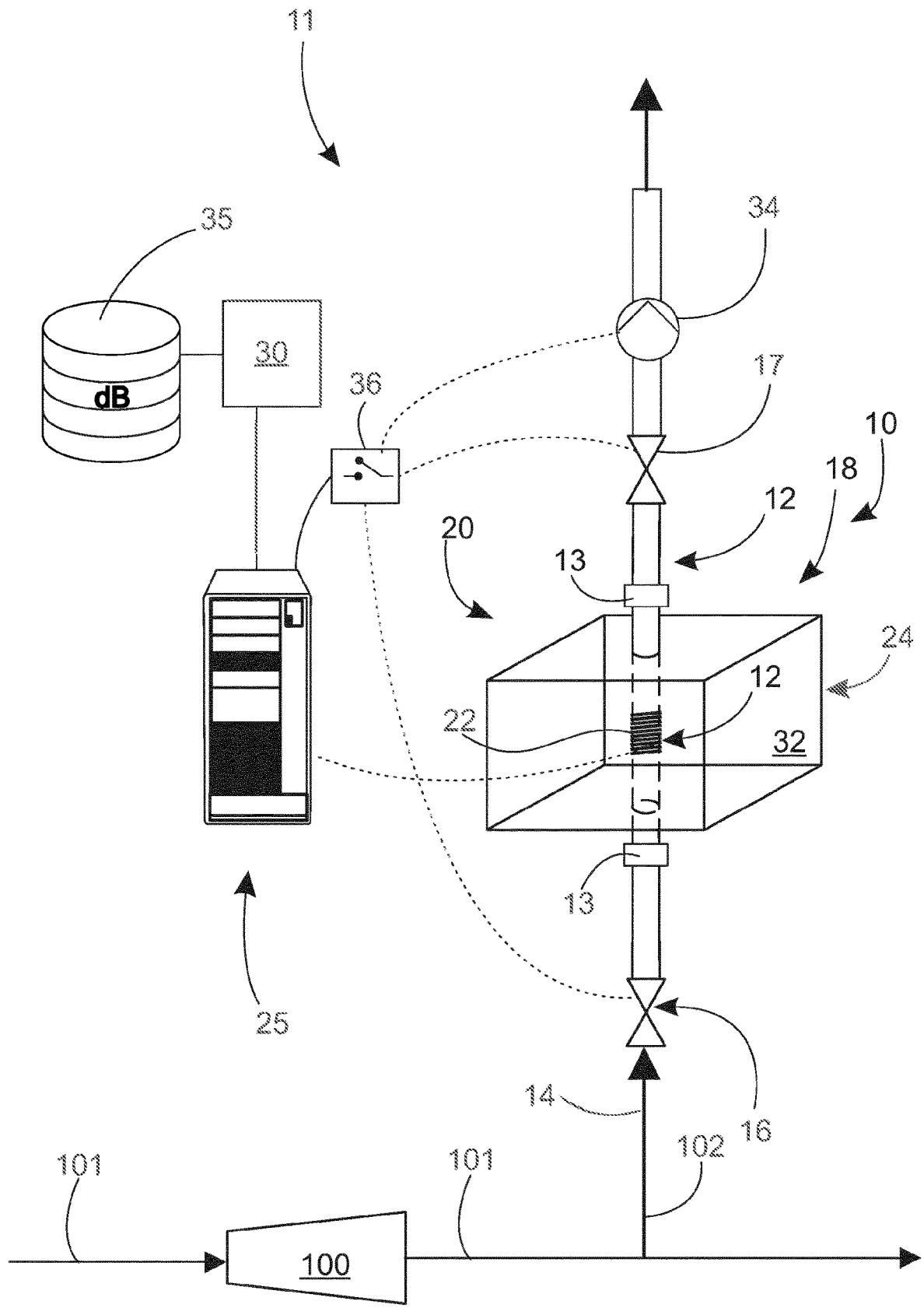
FIG. 3 is a basic overview of a system according to the invention.

More specifically, the NMR spectroscope 20 of the device 10 according to the invention includes a sample channel 12, at least one coil 22 for exciting protons p contained in free and bound water of fibres in the fibre suspension flow, arranged around the sample channel 12 as shown in FIG. 3. The NMR spectroscope 20 also includes a magnet 24 arranged around the sample channel 12 for generating a magnetic field E in the sample channel 12. Advantageously, the magnet 24 is also arranged around the coil 22 in the radial direction relative to the sample channel 12 above the coil 22. The magnetic field E generated by the magnet 24 is advantageously a magnetic field as homogeneous and static as possible, through which the fibre suspension flow 14 passes inside the sample channel 12. The magnetic field E is depicted in the figure with lines in the transverse direction relative to the sample channel. The direction of the magnetic field is advantageously transverse relative to the longitudinal direction of the sample channel. The magnet is advantageously a permanent magnet, which can be implemented without separate driving power in order to operate. A permanent magnet generates a static permanent magnetic field in itself. Alternatively, the magnet can also be an electromagnet, the magnetic field of which is provided by electric current.

Figure 4:
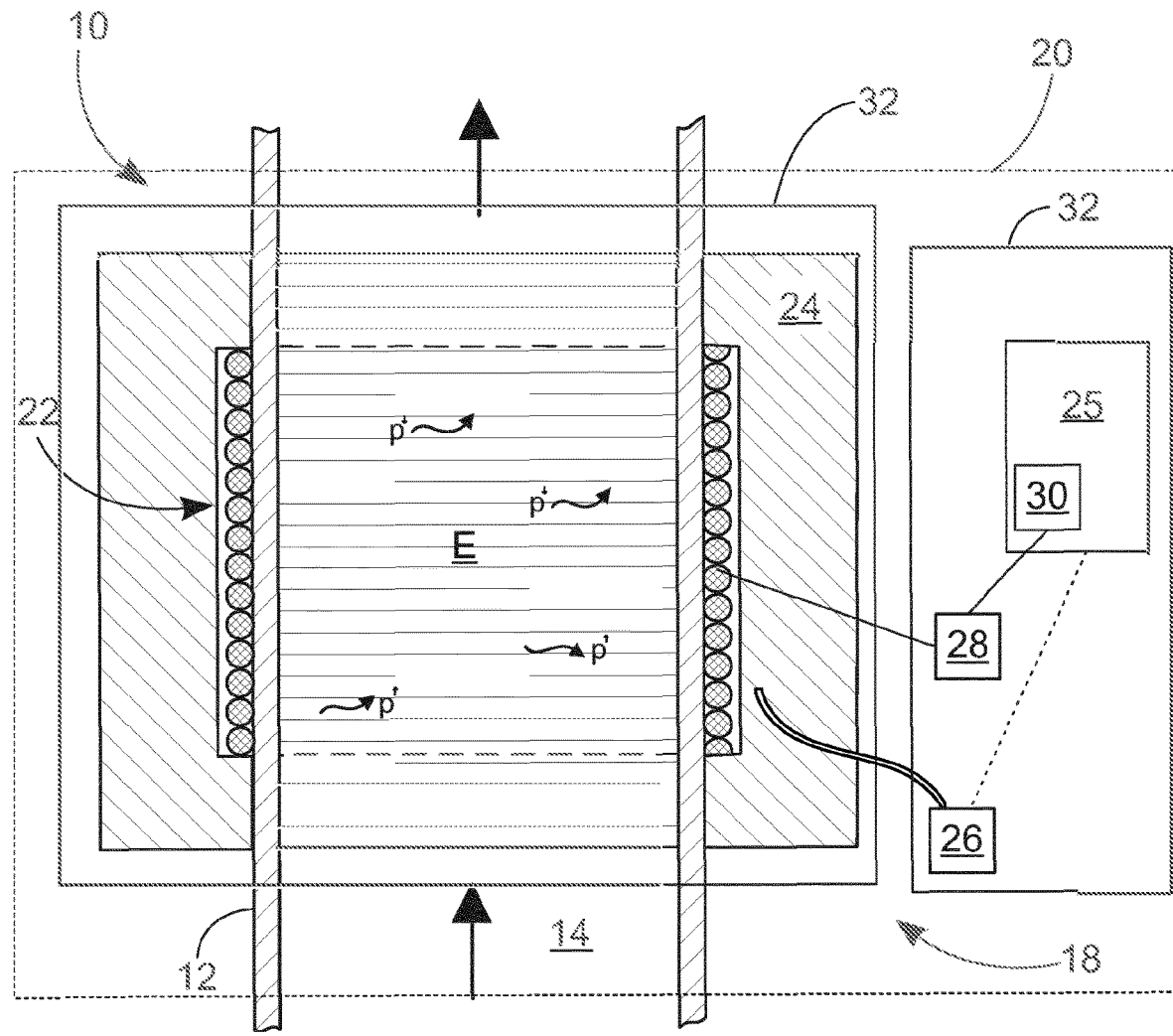
FIG. 4 is a cross-sectional view of a device according to the invention.

In addition, the NMR spectroscope 20 includes, as shown in FIGS. 3 and 4, a power source 26 connected to a coil 22 for generating frequency pulses, measuring equipment 28 for measuring the intensity of voltage generated by the frequency pulse returning to the coil 22 from protons p for generating a return signal, and programmable means 30 for determining fibre porosity of samples based on the return signal and for controlling a first valve 16 for taking samples. With the power source 26, a frequency pulse is delivered to the coil 22 to excite protons p contained in bound and free water travelling inside the coil 22 into a higher energy state (spin) as the protons absorb the frequency pulse. This energy state discharges rapidly (in milliseconds), the proton p thereby delivering or emitting energy to its surrounding, which again generates a voltage in the coil 22, i.e., a return signal, the amplitude of which can be measured with the measuring equipment 28.

The equipment 18 of the device 10 further includes a computer 25 equipped with programmable means for determining fibre porosity of samples based on the return signal by determining the proton relaxation time and the amplitude of the return signal from the return signal and fibre porosity of a fibre suspension based on the relaxation time and the amplitude.

Advantageously, the magnet 24, the coil 22 and the sample channel 12 are encased using a box construction 32 according to FIG. 3. Advantageously, the box construction is made of metal, thus preventing expansion of the magnetic field to the environment and, on the other hand, access of disturbances external to the device to the magnetic field. In this way, the device according to the invention can easily provide a closed magnetic field and is thus easily applicable in mill conditions. Basically, the aforementioned components of the NMR spectroscope 20 can be placed within the same box construction; however, there are preferably two box constructions. One box construction includes measuring equipment 28, a computer 25 and a power source 26, whereas the other box construction encloses a magnet 24 and a coil 22. In this way, damage to sensitive electronic components is avoided in cases of leaking of a water-containing fibre suspension.

The relaxation time correlates with the ratio of free water to bound water contained in fibres in the fibre suspension, which ratio will change during refining as fines detach on the surface of fibres and fibres fibrillate. With increasing fibrillation, the relaxation time T2 decreases. The so-called CPMG (Carr-Parcell-Meiboom-Gill) pulse sequence, which contains one 90° pulse and several 180° pulses, can be used to determine the spin-spin relaxation time T2. Amplitudes of echoes of the pulse sequence attenuate according to the following equation:

$$a(t)=a_o \exp(-t/T2),$$

where $a_0$ is the amplitude at the time t=0s and T2=spin-spin relaxation time. Parameters $a_o$ and T2 can be defined by placing the equation in an experimental signal.

The diameter of the sample channel can be at least 10 mm, preferably 10-20 mm, to allow for the fibre suspension to flow in the sample channel without problems. The dry solids content of the fibre suspension can generally range between 0.5% and 4.0% by weight, at which it remains pumpable. Fibre suspensions at a higher dry content may require a higher pressure to move in the sample channel, but when placed after the refiner, the sample is taken from the fibre suspension flow where the pressure is generally sufficient. Advantageously, a separate pump is also used in the side flow channel for moving the fibre suspension forward. A small diameter of the sample channel proposed above also enables the use of a smaller coil. In this case, the centre hole of the magnet placed on the coil, advantageously above the sample channel, can have a smaller diameter, approximately as small as between 30 mm and 40 mm. The manufacturing costs of the magnet are generally the lower, the smaller is the hole that needs to be produced in the magnet.

The device according to the invention can be realised using one coil or with two coils. When one coil is used, the same coil both delivers and receives the frequency pulse. When two coils are used, one coil can deliver the frequency pulse and the other one receives it. The use of one coil is possible, if the sample flows so slowly that the same protons that are exposed to the frequency pulse will also have time to deliver the return signal in the coil area. Alternatively, the device may include two valves, which are used to stop the sample for a moment at the coil and the magnet. In turn, the use of two coils enables the determination of porosity from a moving flow when correctly adjusted. The coil, also called a bobbin, used in the device is electrically dimensioned in such a way that, with a selected power source, it can produce the desired frequency pulse, or excitation pulse, in a selected magnetic field. For example, when the strength of the magnetic field E is 0.5 T, the frequency pulse applied is in the frequency range of 25 MHz-26 MHz. Generally, the frequency pulse used is in the range of 50 kHz-150 MHz. When one coil is used for the measurement, the length of the coil used may be approximately 10-20 cm, whereby protons in the fibre suspension flow will have time to get excited and deliver energy across the coil. The coil may have 100-200 turns.

Energy released by the proton p excited according to FIG. 3 provides a return frequency in the coil 22, which can be measured as a return signal. The return signal to be measured can be measured with extremely sensitive measuring equipment 28, for example, with a receiver whose measuring accuracy can be in the class of 1 μV. The return signal to be measured is only an average signal; that is, momentary values are measured for the return signal in a certain period and, based on these values, an average is calculated for this period. In other words, the entire spectrum is not measured, as is usually the case in spectroscopy. For example, the duration of the period may be between 0.5 s and 2.0 s. Based on the strength of the return signal, the relaxation times T1 and T2 of the proton can be calculated. The relaxation time can be calculated with the following formula: $T2=-t/\{\ln[a(t)/a_o]\}$ Programmable means 30 have been implemented in a computer 25, which can be used for presenting results as well as for controlling the device. The computer can be a normal PC or equivalent. The material of the flow channel is preferably glass, Teflon or other equivalent non-magnetic material, which does not disturb the generation of the magnetic field within the flow channel. In turn, the power source is an AC power source, in relation to which a frequency converter can be used to achieve the correct frequency.

The control of device operations can take place with the same computer, provided with programmable means for determining fibre porosity using an empirical formula based on measured relaxation times. To control the device, it is possible to use separate control software that provides electric controls via a field bus, for example, for valve actuators, which open the valve of the flow channel for taking the sample either periodically or continuously.

Figure 5:
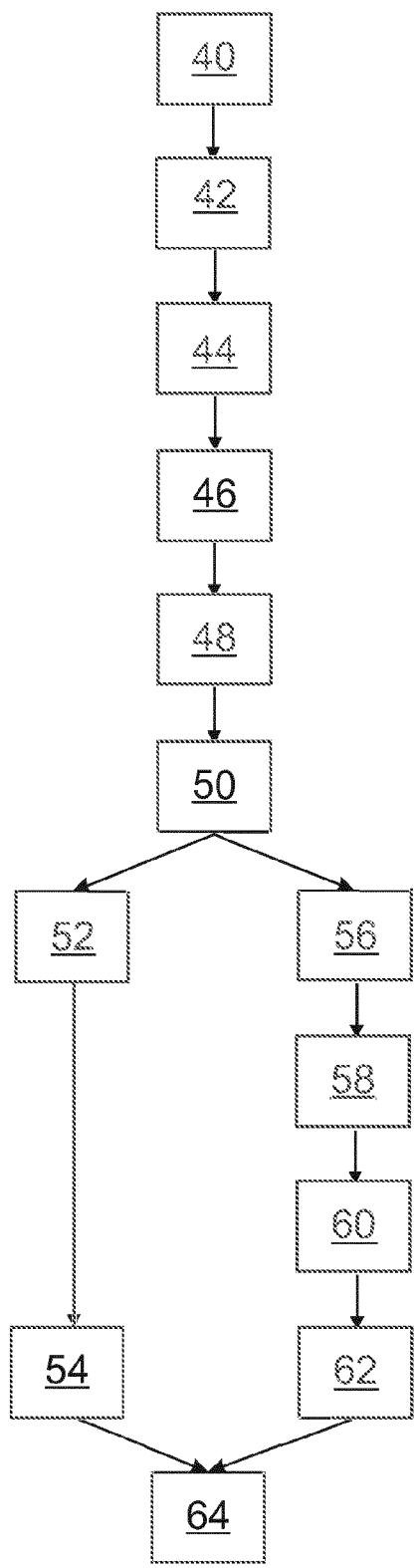
FIG. 5 is a block diagram illustrating the steps of the method according to the invention.

FIG. 5 shows steps 40-62 of an embodiment of the method according to the invention in a block diagram. The method according to the invention starts from taking of a sample, either after the refiner 100 according to FIG. 1a, or both before and after the refiner 100 according to FIG. 1b. Advantageously, the sample is taken, according to FIG. 1b, both before the refiner 100 and after the refiner 100 by leading the fibre suspension to a separate side flow channel 102 as a sample, according to step 40, which allows determination of the fibre porosity of the sample. Connected to the flow channel 101 that enters the refiner 100 or exits the refiner 100, there is a side flow channel 102 having a first valve 16 and a second valve 17. By opening the first valve 16, part of the fibre suspension is led to the side flow channel 102 as a sample either periodically or continuously. Advantageously, the flow is led to the side flow channel 102 periodically, since then the sample flow can be stopped within the magnet of the device 10 for the duration of the measurement by means of the first valve 16 and the second valve 17. Periodically repeated, sampling can be repeated at intervals of 1 to 2 minutes, for example.

The first valve 16 and the second valve 17 are controlled preferably with a computer 25 and computer-operated programmable means 30, in which the sampling interval or the necessary volumetric flow per period has been defined. Based on the control software, the computer 25 sends a control command via a field bus, for example, advantageously to a relay 36 of FIG. 2, via which the power supply is connected to the actuators of the first valve 16 and the second valve 17. Advantageously, the first valve 16 and the second valve 17 are solenoid valves, since solenoid valves are not as sensitive to environmental disturbances as other valve types. When the power supply to the actuators of the valves 16 and 17 is disconnected with the relay 36, the valves 16 and 17 will close, while when under voltage, the valves 16 ja 17 are in their open positions enabling the fibre suspension flow in the side flow channel 102.

Advantageously, the side flow channel 102 also includes a pump 34, with which a fibre suspension that is difficult to move can be reliably transferred along the side flow channel 102 to the equipment 18 for determining fibre porosity. For example, the pump can be a hose pump. Advantageously, power is supplied to the pump 34 via the same relay 36 so that the entire sampling process can be managed by controlling one relay 36. The sample is aspirated to the side flow channel 102, until the sample is conveyed into the magnet 24, at which time the power supply to the first valve 16 and the second valve 17 is disconnected with the relay 36, at which time these will close. At the same time, the power supply to the pump 34 is disconnected. The control of the relay 36 can be implemented by time control, for example.

At the same time, a magnetic field has been generated in the device preferably using a permanent magnet applied as the magnet 24 in the device, according to step 42 of FIG. 4. The purpose of the magnetic field is to enable excitation of protons with frequency pulses generated by the coil 22. When generated by a permanent magnet, the magnetic field is permanent and does not require any specific control. The computer can also be associated with an electronic control unit controlled by the control means, while the control unit, in turn, controls the power source of the device to generate frequency pulses for the coil, according to step 44 of FIG. 4. Frequency pulses are preferably generated at the frequency indicated above while the sample is in the magnetic field. Advantageously, the frequency pulse used is the so-called CPMG frequency pulse, which includes one 90° pulse and several 180° pulses. Pulses are delivered one after the other and they excite the protons in the magnetic field, according to step 46 of FIG. 4. The excitation is very rapidly discharged and the energy delivered by the proton arrives at the coil providing a low voltage in the coil, which is measured with the measuring equipment according to step 48. From the measuring equipment, the voltage data can be transferred in the analog form to an A/D converter or as a digital signal directly to the computer 25, where it will be stored in a memory 35 with the programmable means 30 for further processing.

The amplitude of voltage is advantageously measured continuously, and momentary measuring results of voltage are stored in the memory. Advantageously, the sample in the magnetic field is exposed to four different frequency pulses generated with the coil generating thereby four different attenuating signals, the amplitudes of which are measured with the measuring equipment. Based on the amplitudes measured, an average value can be calculated with the programmable means. In addition, an average value can be calculated over successive samples, since variations between individual samples are notably greater than variations between the successive signals of the same sample.

The proton relaxation time T1 or T2 calculated based on the measured amplitude of the return signal is used together with an empirically defined calculation model to determine fibre porosity with the programmable means 30 in step 50 of FIG. 5. The general form of the calculation model is as follows:

$$Exp = \left(\sum_1^4 A_x \exp(R_x * t)\right) + C$$

The model uses a relaxation speed or $R_x$, the ratio of which to the relaxation time T is $T=1/R$.

The number of summable exponential factors used in the model can be between one and four, preferably one or two, most preferably two. The value of the exponential signal is directly obtained in the NMR measurement by the measuring equipment, measured at the coil and, based on it, it is possible to calculate the relaxation time and the amplitude using general calculation methods.

Example values for both spruce and birch pulps are given below:

|       | Spruce   | Birch    |
|-------|----------|----------|
| $A_I$ | 1.482173 | 2.316276 |
| $A_E$ | 23.29918 | 20.00418 |
| $R_{2I}$ | 3.31536 | 3.007642 |
| $R_{2E}$ | 0.765683 | 0.985788 |

Figure 7:
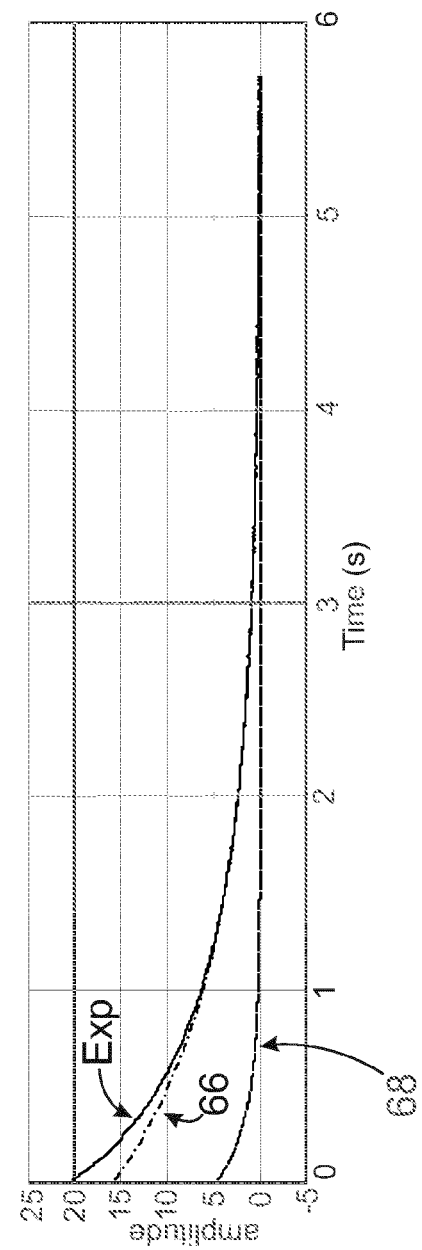
FIG. 7 is a graphic representation of the double exponential model.

In the simplified single exponential factor model, the calculation is based on an empirical assumption that the experimental signal consists of one exponential signal as follows:

$$Exp = A * \exp(R_2 * t),$$

where, based on the strength of the exponential signal determined by NMR spectroscopy, the relaxation speed $R_2$ calculated in step 52 of FIG. 5 gives the average movement state of water molecules. The form of the exponential signal in the case of the double exponential model is shown in FIG. 7, but it should be understood that the single exponential model also follows quite well the shape of the exp curve of FIG. 7. With $R_2$, it is possible to calculate the WRV value representing filtration of water in step 54 utilising the linear formula and calibration:

$$WRV_{NMR} = kk * R_{2corr} + \text{constant},$$

where $R_{2corr} = R_2 - a*(c - c_{ref})$ and kk is the slope of the linear formula, a is an empirical constant, c is the sample consistency, $c_{ref}$ is the reference consistency and $R_{2corr}$ is the relaxation speed $R_2$ corrected relative to consistency. This value corresponds to the WRV value measured in laboratory (unit g/g). In the calculation, in addition to the relaxation time, the NMR measurement provides the signal amplitude A, which is utilised in the calculation. The slope kk can be determined utilising calibration samples, for which the WRV values are known. As reference consistency, it is possible to use a selected value, relative to which all values are corrected computationally. Advantageously, the reference consistency can be 0.5%-4.0%, preferably 1.0-2.0%, most preferably 1.6%.

Particularly good accuracy has been achieved with an empirical constant value of 0.186 1/(%*s). Below is a description of parameters used in the NMR spectroscope, the use of which has provided particularly good accuracy with the empirical constant value. A resonance frequency of 21.73 MHz was used and the echo time in the CPMG pulse sequence is 2 ms. The time between the CPMG pulse sequences (same sample) is 6000 ms, when more than one pulse sequence is summed up, after which the sample is changed in the NMR spectroscope with a pump. If the number of samples is one, then the time between pulse sequences is 100 ms (sample changed in-between). The width of a 90 degrees pulse is 16 or 35 microseconds, while the width of a 180 degrees pulse is 36 or 70 microseconds depending on the magnet and the sample unit. With the aforementioned parameters, the value of the empirical constant can range between 0.1859 and 0.276.

Alternatively, for the single exponential factor model, it is possible to use the double exponential factor or the so-called physical model in the calculation, where the experimental signal Exp consists, as shown in FIG. 7, of two exponential parts, of which part 66 is from fibre-internal water and part 68 is from fibre-external water. This is because the exchange between fibre-external and fibre-internal water is slow. The experimental signal can be represented by the following formula:

$$Exp = A_I * exp(R_{2I} * t) + A_E * exp(R_{2E} * t) + C,$$

where amplitudes $A_I$ and $A_E$ indicate how much there is water in fibre and outside of it. Relaxation speeds calculated from the strength of the exponential signal in step 56, $R_{2I} = p_{IB} * R_{IB} + p_{IF} * R_{IF}$ and $R_{2E} = p_{EB} * R_{EB} + p_{EF} * R_{EF}$, indicate the average movement state of water molecules inside and outside fibre. Water internal and external to fibre takes two different states: bound ($p_B$) and free ($p_F$). In addition, it is known that $p_{IB} + p_{IF} = 1$ and $p_{EB} + p_{EF} = 1$. The relative amplitude $A_{I\_rel}$ indicates the proportion of water inside fibre and can be determined in step 58 with the following formula:

$$A_{I\_rel} = 100\% * A_I/(A_I + A_E),$$

whereas the relative amplitude $A_{E\_rel}$ indicates the proportion of water outside fibre and can be determined with the following formula:

$$A_{E\_rel} = 100\% * A_E/(A_I + A_E).$$

Both portions include both bound and free water.

The proportions of bound water p in fibre and outside fibre can be calculated in step 60 as follows:

$$p_{IB} = (R_{2I} - R_{2F})/(R_{2B} - R_{2F})$$ and $$p_{EB} = (R_{2E} - R_{2F})/(R_{2B} - R_{2F}),$$

where $R_{2F}$ is the relaxation time of completely free water, which can be measured, and $R_{2B}$ is the relaxation time of completely bound water, which can be assessed. The assessment can be done using a calibration constant; i.e., by defining an experimental WRV value for the sample, based on which the correct value is calculated for the relaxation speed of completely bound water $R_{2B}$. Alternatively, $R_{2B}$ can be defined experimentally with the NMR equipment from a sample from which free water has been removed by centrifugation, for example, before the NMR measurement.

The product $A_{I\_rel} * p_{IB}$ indicates how large a portion from the total water amount is bound inside fibre and the product $A_{E\_rel} * p_{EB}$ indicates how large a portion of the total water amount is bound outside fibre.

The expression $$W_{IB} = A_{I\_rel} * p_{IB} * (100-c)/c$$

indicates how many grams of water is bound per each gram of fibre inside fibre and $$W_{EB} = A_{E\_rel} * p_{EB} * (100-c)/c$$

outside fibre (the unit is g/g), with c being the sample consistency (%).

Finally, it is possible to calculate, in step 62, the WRV value determined with the NMR technique using the following formula:

$$WRW\_NMR = W_{IB} + W_{EB}$$

This value corresponds to the WRV value measured in laboratory (unit g/g).

According to an advantageous embodiment, the fibre porosity WRV value calculated in step 54 using the single exponential signal model and the fibre porosity WRV value calculated in step 62 using the double exponential signal model are compared to each other 64 for evaluating the reliability of calculation. A reliability metric can be, for example, the percent deviation of these two calculated WRV values relative to each other or relative to the previously calculated value. The final porosity measurement result can be an average of these WRV values or a filtered average.

Figure 6:
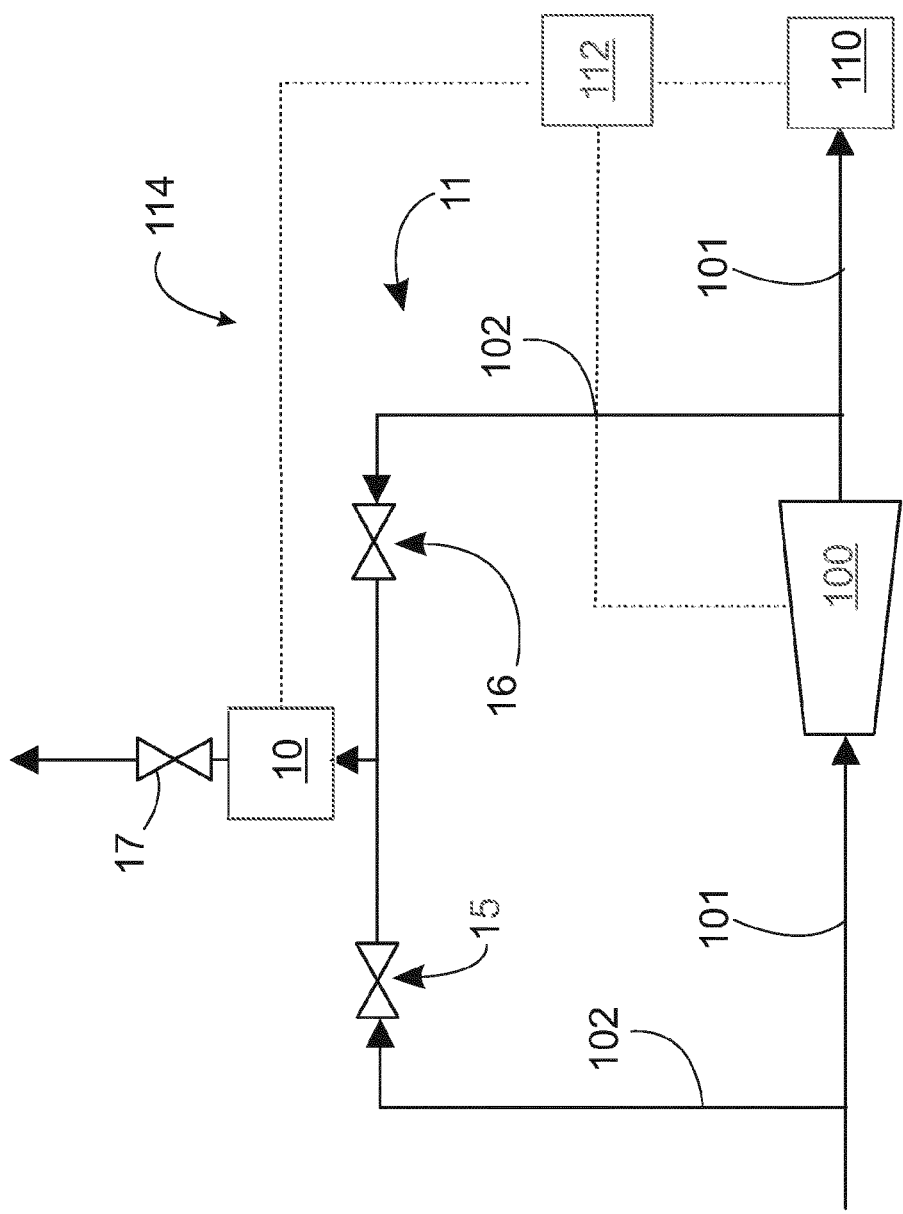
FIG. 6 is a basic view of the design of a control system according to the invention.

FIG. 6 shows an example of a control system 11 according to the invention. The control system 11 includes, in all of the embodiments, a device 10 according to the invention for measuring the porosity of fibres of a fibre suspension exiting the refiner 100, a computing unit 112 for calculating control parameters based on fibre porosity measured with the device 10 and a selected target, and data transfer equipment 114 for transferring control parameters from the computing unit 112 to the refiner 100 or the fibre web machine 110 or both. Information on fibre porosity can be utilised to control refining or improve the runnability of a fibre web machine 110 or both. Fibre porosity is measured at least from the fibre suspension that exits the refiner 100, but the measurement can be preferably performed both before and after the refiners 100 as in FIG. 6. In this way, it is possible to obtain accurate information about the effect of refining on the properties of fibres of the fibre suspension.

In the control system, the computing unit 112 receives the fibre porosity information relating to the sample, calculated in near real time by the device 10, using the data transfer equipment 114, along a field bus, for example. A target value, which is the desired fibre porosity value, has preferably been entered in the computing unit 112. The remainder between the measured value and the target is calculated and, based on the remainder, the refiner is controlled, for example, by changing the specific energy consumption of refining or the blade angles of the refiner. The control performed based on the porosity value can also consist of controlling the fibre web machine, for example, by changing the ratio of fibre suspension to fillers in paper production, steam use in the dryer section of a fibre web machine or press pressures in the press section.

The computing unit of the control system can be a separate computer, but the computing unit of the control system is preferably integrated into the computer of the device according to the invention. Advantageously, the control system 11 includes, according to FIG. 6, two side flow channels 102 for taking a sample both before and after the refiner 100. In addition, the control system preferably also includes a first valve 16 and a third valve 15, with which the sample can be stopped at the device 10. If the sample is taken before the refiner 100, the sample is stopped by using a second valve 17 and the third valve 15. If the sample is taken after the refiner 100, the sample is stopped by using the second valve 17 and the first valve 16. The computing unit 112 is arranged to calculate fibre porosity from the samples taken before and after the refiner 100 and the related comparison value and to control the refiner 100 or the fibre web machine 110 based on the comparison value. The control of the refiner can be feedback control and it is possible to use prior art PID controllers associated with the control for accelerating the control.

According to an embodiment, programmable means of the device are arranged to use previous memorised porosity measurement values for calculating the control in such a way that two or more last porosity measurement values are used to calculate an average or other statistical value, with which the significance of an individual measurement deviation on the control is reduced and the control is stabilised.

As a part not included in the invention, it can be contemplated that the NMR spectroscope is only used for determining the amount of fibre-internal and fibre-external water. The amount of fibre-internal water correlates to how refining has provided fibre-internal fibrillation, whereas the amount of external bound water correlates to how refining has provided fibre-external fibrillation. In this way, based only on the amounts of fibre-external and fibre-internal water, it is possible to conclude facts about the performance of refining without determining fibre porosity as a whole.

It will be understood that the above description of the present invention is susceptible to various modifications, changes, and adaptations, and that the same are intended to be comprehended within the meaning and range of equivalents of the appended claims.

The invention claimed is:

1. A method for determining fibre porosity in a fibre suspension, comprising steps of:
   diverting a sample from the fibre suspension in a fibre suspension flow channel to a side flow channel;
   leading the sample in the side flow channel to an online NMR spectroscope;
   generating a magnetic field for exciting protons of water contained in the sample;
   providing radiofrequency pulses by a coil for exciting the water molecules of the sample;
   measuring return signals of the radiofrequency pulses returning from the water molecules to the coil;
   determining a proton's relaxation time and an amplitude of the return signal from each return signal;
   determining a ratio of fibre-internal water to fibre-external bound water based on the amplitudes and the relaxation times of an exponential of the return signals using a double exponential signal model $Exp=A_I*exp(R_{2I}*t)+A_E*exp(R_{2E}*t)+D$ for determining the relaxation time, where $A_I$ is an amplitude representing an amount of fibre-internal water, $R_{2I}$ is a relaxation speed of fibre-internal bound water, $A_E$ is an amplitude representing an amount of fibre-external water, $R_{2E}$ is a relaxation speed of fibre-external bound water, and D is an empirical constant; and
   determining the fibre porosity as a Water Retention Value (WRV) in successive steps including:
      calculating, based on the amplitudes $A_I$ and $A_E$, a relative amount of fibre-internal water $A_{I\_rel}$ and a relative amount of fibre-external bound water $A_{E\_rel}$;
      calculating a proportion of fibre-internal bound water $p_{IB}$ based on a relaxation speed of completely free water $R_{2F}$, a relaxation speed of completely bound water $R_{2B}$ and the relaxation speed of fibre-internal bound water $R_{2I}$;
      calculating a proportion of fibre-external bound $p_{EB}$ based on the relaxation speed of completely free water $R_{2F}$, the relaxation speed of completely bound water $R_{2B}$ and the relaxation speed of fibre-external bound water $R_{2E}$;
      calculating an amount of fiber-internal bound water $W_{IB}$ based on the relative amount of fibre-internal water $A_{I\_rel}$, the proportion of fiber-internal bound water $p_{IB}$ and a consistency c of the fibre;
      calculating an amount of fibre-external bound water $W_{EB}$ based on the relative amount of fibre-external water $A_{E\_rel}$, the proportion of fiber-external bound water $p_{EB}$ and the consistency c of the sample; and
      calculating the WRV value as a sum of the amount of fibre-internal bound water $W_{IB}$ and the amount of fiber-external bound water $W_{EB}$.

2. The method according to claim 1, wherein the value of the empirical constant D is between 0 and 1.

3. The method according to claim 1, further comprising further steps of:
   determining the fibre porosity using both a single exponential signal model and the double exponential signal model by steps including:
   forming a first porosity value based on a single exponential signal model $Exp=A*exp(R_2*t)$ for determining the relaxation time and a linear formula $WRV_{NMR}=kk*[R_2-a*(c-c_{ref})]+C$ for determining fibre porosity as a WRV value, where kk is a slope of the linear formula, C is a second empirical constant, a is another empirical constant, and $c_{ref}$ is a reference consistency, and forming a second porosity value based on the double exponential signal model; and
   comparing the first porosity value and the second porosity value with each other for forming a comparison result.

4. The method according to claim 3, wherein the comparison result is calculated as a difference of the first porosity result and the second porosity result and by dividing the difference by the first porosity result and, if the comparison result is less than 5% of the first porosity result, the fibre porosity is calculated as an average of the first porosity result and the second porosity result.

5. The method according to claim 1, comprising determining a ratio of bound water to free water both inside fibre and outside fibre.

6. A device for determining a fibre porosity of a fibre suspension, including:
   a time-domain NMR spectroscope for determining the fibre porosity based on a fibre sample of the fibre suspension as an online measurement; and
   connection equipment for connecting the time-domain NMR spectroscope to a refiner for refining a fiber suspension, either directly to a fibre suspension flow channel or to a side flow channel, which side flow channel is arranged to lead part of the fibre suspension flow arriving from the refiner to form a separate sample;
   wherein the time-domain NMR spectroscope comprises:
      a sample channel;
      at least one coil arranged around the sample channel to excite water protons of the fibre suspension contained in the sample by frequency pulses;

a magnet arranged around the sample channel for generating a magnetic field in the sample channel;

a power source with controllers connected to the coil for generating the frequency pulses;

measuring equipment for measuring an intensity of current generated by the frequency pulses returning to the coil from protons for generating return signals; and a computer equipped for determining the fibre porosity of samples based on the return signals, by being arranged to:

determine a proton's relaxation time and an amplitude of each return signal using a double exponential signal model $Exp=A_I*exp(R_{2I}*t)+A_E*exp(R_{2E}*t)+D$ for determining the relaxation time, where $A_I$ is an amplitude representing an amount of fibre-internal water, $R_{2I}$ is a relaxation speed of fibre-internal bound water, $A_E$ is an amplitude representing an amount of fibre-external water, $R_{2E}$ is a relaxation speed of fibre-external bound water, and D is an empirical constant;

determine the fibre porosity as a Water Retention Value (WRV); and calculate:

a relative amount of fibre-internal water $A_{I\_rel}$ and a relative amount of fibre-external water $A_{E\_rel}$, based on the amplitudes $A_I$ and $A_E$;

a proportion of fibre-internal bound water $p_{IB}$ based on a relaxation speed of completely free water $R_{2F}$, the relaxation speed of completely bound water $R_{2B}$ and the relaxation speed of fibre-internal bound water $R_{2I}$;

a proportion of fibre-external bound water $p_{EB}$ based on the relaxation speed of completely free water $R_{2F}$, the relaxation speed of completely bound water $R_{2B}$ and the relaxation speed of fibre-external bound water $R_{2E}$;

an amount of fiber-internal bound water $W_{IB}$ based on the relative amount of fibre-internal water $A_{I\_rel}$, the proportion of fibre-internal bound water $p_{IB}$ and a consistency c of the sample;

an amount of fibre-external bound water $W_{EB}$ based on the relative amount of fibre-external water $A_{E\_rel}$, the proportion of fibre-external bound water $p_{EB}$ and the consistency c of the fibre sample; and the WRV value as a sum of the amount of fibre-internal bound water $W_{IB}$ and the amount of fibre-external bound water $W_{EB}$.

7. The device according to claim 6, comprising a pump for aspirating the sample from the flow channel to the side flow channel and to the time-domain NMR spectroscope located in the side flow channel after the refiner.

8. A control system for a fibre web machine, the control system comprising:

a device according to claim 6 for measuring a fibre porosity of a fibre suspension exiting a refiner;

a computing unit for calculating control parameters based on the fibre porosity measured with the device and a selected target, wherein the computing unit is arranged to calculate fibre porosity and a related comparison value from the samples taken before and after the refiner and to control the refiner or the fibre web machine based on the comparison value;

data transfer equipment for transferring control parameters from the computing unit to the refiner or the fibre web machine or both, and two side flow channels for taking a sample both before and after the refiner.

9. The control system according to claim 8, further comprising a first valve and a further valve arranged in the side flow channels for stopping the sample during measurement.

\* \* \* \* \*